United States Patent [19]

Takaoka

[11] 4,197,508
[45] Apr. 8, 1980

[54] PERIOD-TO-VOLTAGE CONVERTING DEVICE
[75] Inventor: Saburo Takaoka, Tokyo, Japan
[73] Assignee: Pioneer Electronic Corporation, Tokyo, Japan
[21] Appl. No.: 874,085
[22] Filed: Feb. 1, 1978
[30] Foreign Application Priority Data
  Feb. 4, 1977 [JP] Japan .................................. 52/10788
[51] Int. Cl.² .............................................. H03K 5/00
[52] U.S. Cl. .................................... 328/140; 328/151; 307/246; 307/261
[58] Field of Search ................ 328/151, 140; 307/246, 307/353, 261
[56] References Cited
U.S. PATENT DOCUMENTS

| 3,535,658 | 10/1970 | Webb | 328/151 |
| 3,723,771 | 3/1973 | McLean | 307/246 X |
| 3,852,619 | 12/1974 | Carbrey | 328/151 X |
| 3,968,447 | 7/1976 | Baylac et al. | 307/271 X |

Primary Examiner—Stanley D. Miller, Jr.
Attorney, Agent, or Firm—Sughrue, Rothwell, Mion, Zinn and Macpeak

[57] ABSTRACT

A period-to-voltage converting device for producing an output voltage corresponding to the varying period of an input signal. The input signal is applied to a frequency divider and a simple logic circuit to control the charging and discharging of first and second capacitors. A charging circuit responsive to a first timing pulse having a width equal to half a period of an input signal charges the first capacitor to a predetermined voltage. A discharging circuit responsive to a second timing pulse having a width equal to the period of the input signal discharges the first capacitor at a constant rate. Another charging circuit responsive to a third timing pulse having a width equal to half a period of the input signal charges the second capacitor to the same voltage across the first capacitor, this voltage being the output voltage proportional to the period of the input signal.

2 Claims, 13 Drawing Figures

INPUT AT
TERMINAL 9

OUTPUT OF
MONOSTABLE 1

OUTPUT OF
MONOSTABLE 2

VOLTAGE
ACROSS
CAPACITOR 6

VOLTAGE
ACROSS
CAPACITOR 8

INPUT AT TERMINAL 9

OUTPUT OF DIVIDER 11

OUTPUT OF AND GATE 15

OUTPUT OF AND GATE 16

VOLTAGE ACROSS CAPACITOR 6

VOLTAGE ACROSS CAPACITOR 8

PERIOD-TO-VOLTAGE CONVERTING DEVICE

BACKGROUND OF THE INVENTION

This invention relates to a period-to-voltage converting device for producing a voltage corresponding to the period of a pulse signal (hereinafter referred to as "a period-voltage converter" when applicable).

When an electric motor is driven under constant speed control, in general a frequency proportional to the speed of the electric motor is produced and is converted into a DC voltage which is compared to the reference voltage, and the difference voltage between these two voltages is fed back to obtain the constant speed control. The frequency-to-voltage conversion can be achieved, for instance, in a method in which pulse counting is carrier out. However, in this method the voltage obtained by the conversion contains not only DC components but also ripple components, as a result of which the electric motor is driven also by the ripple components. Therefore, if this method is employed for an audio turntable motor, then the S/N ratio will be considerably decreased.

In order to overcome the above-described difficulty, a method is often employed in which the period is converted into voltage according to a sample-and-hold system, which is less affected by the ripple components. One example of such a period-voltage converter is shown in FIG. 1, and various waveforms in the sections of the converter are indicated in FIG. 2. An input signal is applied by a first monostable multivibrator 1 to obtain sampling pulses having a small pulse width which are applied to a second monostable multivibrator 2 to provide charging pulses. The charging pulses are applied to a first gate circuit 3 to open the latter thereby charging a first capacitor 6 to a predetermined voltage. When the charging pulse is not applied, the capacitor 6 starts discharging with the aid of a constant current source 7, as a result of which a saw tooth wave is produced. When the next sampling pulse is produced, a second gate 4 is open, and the voltage of the capacitor 6 is sampled by a second capacitor 8. Thus, a voltage substantially corresponding to the period can be obtained.

It is true that in this mehtod a voltage substantially corresponding to the period can be relatively readily obtained. However, this method still suffers from disadvantages that the pulse width of the sampling pulse and that of the charging pulse are varied with the variation in time constant of the monostable multivibrators which is caused by variation in temperature. This variation in time constant affects the output voltage and lowers the stability. Furthermore, since a capacitor is required for forming the monostable multivibrator, it is necessary to externally mount the capacitor where the converter is manufactured in the form of an integrated circuit.

SUMMARY OF THE INVENTION

Accordingly, an object of this invention is to provide a period-voltage converter simple in construction and high in stability in which the number of capacitors used therein is smaller and which can be readily manufactured in the form of an integrated circuit.

DESCRIPTION OF THE PREFERRED EMBODIMENT

Figures 1, 2A, 2B, 2C, 2D, 2E:
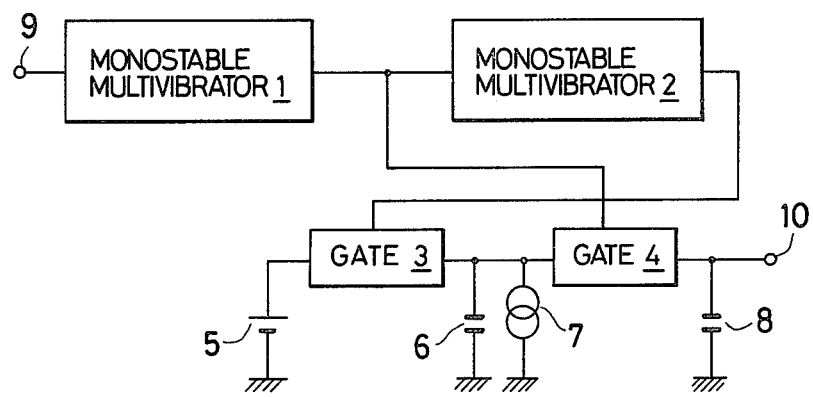
FIG. 1 is a block diagram showing a conventional period-voltage converter.
FIGS. 2A to 2E are waveform diagrams showing the waveforms of signals occurring in the conventional period-voltage converter shown in FIG. 1.
Figure 3:
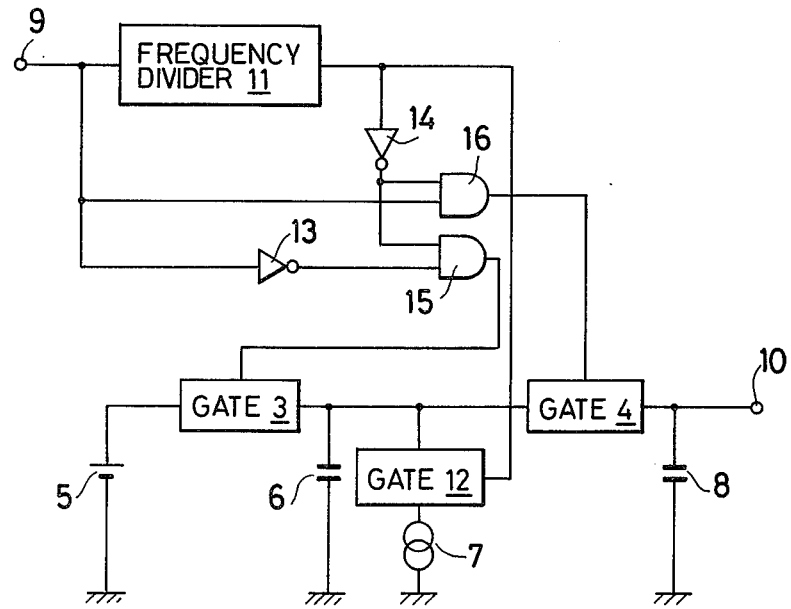
FIG. 3 is a block diagram showing a preferred example of a period-voltage converter according to this invention.
Figure 4A:
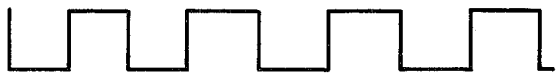
FIGS. 4A to 4F are waveform diagrams showing the waveforms of signals occurring in the period-voltage converter shown in FIG. 3.
Figure 4B:
Figure 4C:
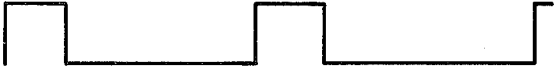
Figure 4D:
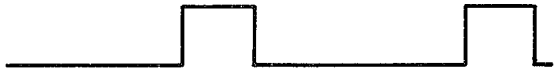
Figure 4E:
Figure 4F:

One preferred example of a period-voltage converter according to this invention is shown in FIG. 3. As is apparent from comparison between FIGS. 1 and 3, a gate circuit 12 is additionally connected in series to the constant current circuit 7, and timing signals for controlling the gate circuits are obtained by means of a frequency divider 11, such as a bistable multivibrator or flip-flop, and a logic circuit. The frequency of an input signal applied to an input terminal 9 is divided by two by the frequency divider 11, and the output signal of the frequency divider 11 is employed as a second timing pulse for opening an output gate circuit 12. The input signal and the output signal of the frequency divider 11 are applied to AND gate circuits 15 and 16 through inverters 13 and 14 as indicated in FIG. 3, thereby forming first and third timing pulses for opening the gate circuits 3 and 4.

The gate opening operations by these three different timing pulses are not overlapped in time as may be seen in FIG. 4. The timing pulses from AND gates 15 and 16 serve to open the respective gate circuits 3 and 4 for a period of time corresponding to half a period of the input signal, while the timing pulse for frequency divider 11 serves to open its gate circuit 12 for a period of time corresponding to one period of the input signal, thus completing one cycle of operation in two periods of the input signal. First, the gate circuit 3 is opened by the timing pulse from AND gate 15, as a result of which the first capacitor 6 is charged to a voltage equal to the reference voltage 5. Then, when the first gate circuit 3 is closed, the third gate circuit 12 is opened by the timing pulse from frequency divider 11, and the first capacitor 6 is discharged for a period of time corresponding to one period of the input signal with the aid of the constant current source 7. The gate circuit 12 is then closed and the discharging operation is suspended, and simultaneously the gate circuit 4 is opened by the timing pulse from AND gate 16 and the second capacitor 8 is charged to a voltage equal to the terminal voltage of the first capacitor 6. In this case, the voltage of the first capacitor 6 is discharged from the predetermined voltage to a voltage obtained by discharging constant current for a period of time corresponding to one period of the input signal. Therefore, the voltage corresponds the period of the input signal, while the voltage of the second capacitor 8 corresponds also to the period. Therefore, by taking the voltage across the second capacitor 8 as the output, an output voltage corresponding to the period of the input signal and substantially free of ripple components can be obtained. As can be seen from the pulse widths of the waveforms illustrated in FIGS. 4A and 4B, for illustrative purposes the period of the input signal is shown as changing at the end of the first positive pulse of the waveform of FIG. 4B.

When the gate circuit 4 is opened, the electric charges in the first capacitor 6 are moved into the second capacitor 8, as a result of which the terminal voltage thereof is changed, which results in the occurrence of an error. However, if the capacitance of the second capacitor 8 is selected to be smaller than that of the first capacitor 6, the voltage variation can be disregarded. In the case where it is required to further reduce the error, the second capacitor 8 may be externally charged by the use of a full-feedback type differential amplifier in such a manner that the potential of the second capacitor 8 is equal to the charge voltage of the first capacitor 6 thereby eliminating the occurrence of the error due to the difference in capacitance between the two capacitors.

In the above-described example, the first capacitor is discharged from the predetermined voltage with the aid of the constant current source 7; however, the same effect can be obtained even if the circuit is so designed as to charge capacitor 6. In this case, the reference voltage 5 may be the ground potential. Furthermore, not only the ½ frequency divider circuit but also a frequency divider circuit in which the frequency is divided by an integer such as for instance three can be employed as the aforementioned frequency divider circuit. In addition, a variety of logic circuits can be employed as the above-described logic circuit to provide the desired timing pulses.

As is apparent from the above description, the period-voltage converter according to this invention is suitable for manufacture in the form of an integrated circuit because the number of capacitors employed therein is smaller, produces an output voltage less affected by the ripple components, and is considerably high in stability because it is not affected by variation in temperature.

What is claimed is:

1. A period-to-voltage converting device for producing an output voltage corresponding to the period of an input signal, and comprising:
   a frequency divider in which the frequency of an input signal is divided by an integer;
   a logic circuit which operates to successively produce a first timing pulse having a pulse width equal to half a period of said input signal, a second timing pulse having a pulse width equal to at least one period of said input signal, and a third timing pulse having a pulse width equal to half a period of said input signal, said logic circuit receiving as inputs said input signal and the output of said frequency divider;
   first and second capacitor circuits;
   a charging circuit for charging said first capacitor circuit to a predetermined voltage in response to said first timing pulse;
   a discharging circuit for subjecting said first capacitor circuit to constant current discharge in response to said second timing pulse; and
   a gate circuit for transferring the electric charges in said first capacitor circuit into said second capacitor circuit in response to said third timing pulse to charge said second capacitor to an output voltage corresponding to the period of said input signal.

2. A period-to-voltage converting device as claimed in claim 1, in which said logic circuit comprises:
   a circuit for producing said first timing pulse by obtaining the logical product of the opposite-phase signal of said input signal and the opposite-phase signal of said frequency divider pulse output;
   a circuit for providing said frequency division pulse output as said second timing pulse; and
   a circuit for producing said third timing pulse by obtaining the logical product of the opposite-phase signal of said frequency divider pulse output and said input signal.

* * * * *